United States Patent
Zepp

[19]

[11] Patent Number: 5,990,713
[45] Date of Patent: Nov. 23, 1999

[54] ADJUSTABLE PHASE CLOCK CIRCUIT USING THE SAME AND RELATED METHODS

[75] Inventor: Stanley R. Zepp, Melbourne, Fla.

[73] Assignee: Harris Corporation, Palm Bay, Fla.

[21] Appl. No.: 09/019,241

[22] Filed: Feb. 5, 1998

[51] Int. Cl.⁶ ..................................................... H03L 7/00
[52] U.S. Cl. ........................... 327/141; 327/156; 327/158
[58] Field of Search .................................. 327/270, 231, 327/236, 237, 241, 243, 244, 233, 141, 155, 156, 158, 159, 161

[56] References Cited

U.S. PATENT DOCUMENTS

| | | | |
|---|---|---|---|
| 4,389,614 | 6/1983 | Staiger | 327/505 |
| 4,777,385 | 10/1988 | Hartmeier | 327/170 |
| 5,050,193 | 9/1991 | Ponsard | 375/108 |
| 5,119,406 | 6/1992 | Kramer | 375/372 |
| 5,146,121 | 9/1992 | Searles | 327/270 |
| 5,278,457 | 1/1994 | Fujita et al. | 327/237 |
| 5,430,394 | 7/1995 | Mcminn | 327/292 |
| 5,491,673 | 2/1996 | Okayasu | 368/120 |
| 5,568,078 | 10/1996 | Lee | 327/262 |
| 5,805,003 | 9/1998 | Hsu | 327/270 |

*Primary Examiner*—Kenneth B. Wells
*Assistant Examiner*—Hai L. Nguyen
*Attorney, Agent, or Firm*—Allen, Dyer, Doppelt, Milbrath & Gilchrist, P.A.

[57] ABSTRACT

An adjustable phase clock includes a number (n) of delay circuits having respective controllable delays and being connected in cascade for generating n respective delayed signals. A first delay circuit receives the input clock signal and an nth delay circuit generates a total delay signal. A phase detector and filter are connected to the n delay circuits for controlling the respective delays thereof so that the total delay signal locks in relation to the input clock, such as to its period. In addition, the adjustable phase clock preferably further permits control of the output based upon selecting one of the n delayed signals having a corresponding adjusted phase delay relative to the input clock signal. Of course, multiple ones of the n delayed signals can also be selected. The adjustable phase clock may be used in a line locking application and an adjustable frequency clock circuit.

27 Claims, 3 Drawing Sheets

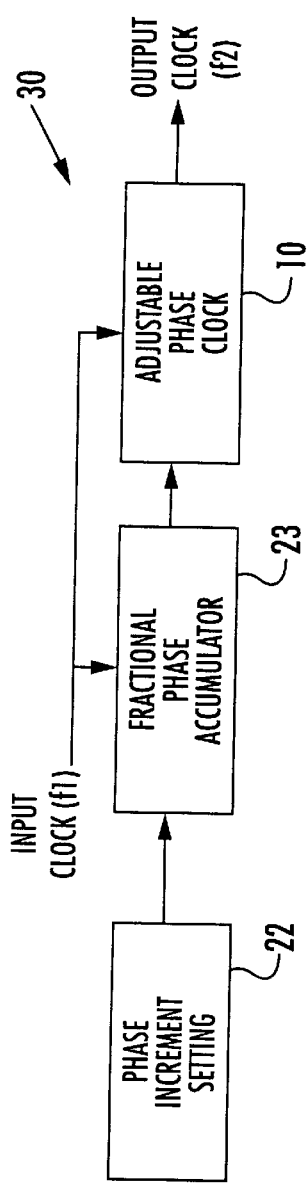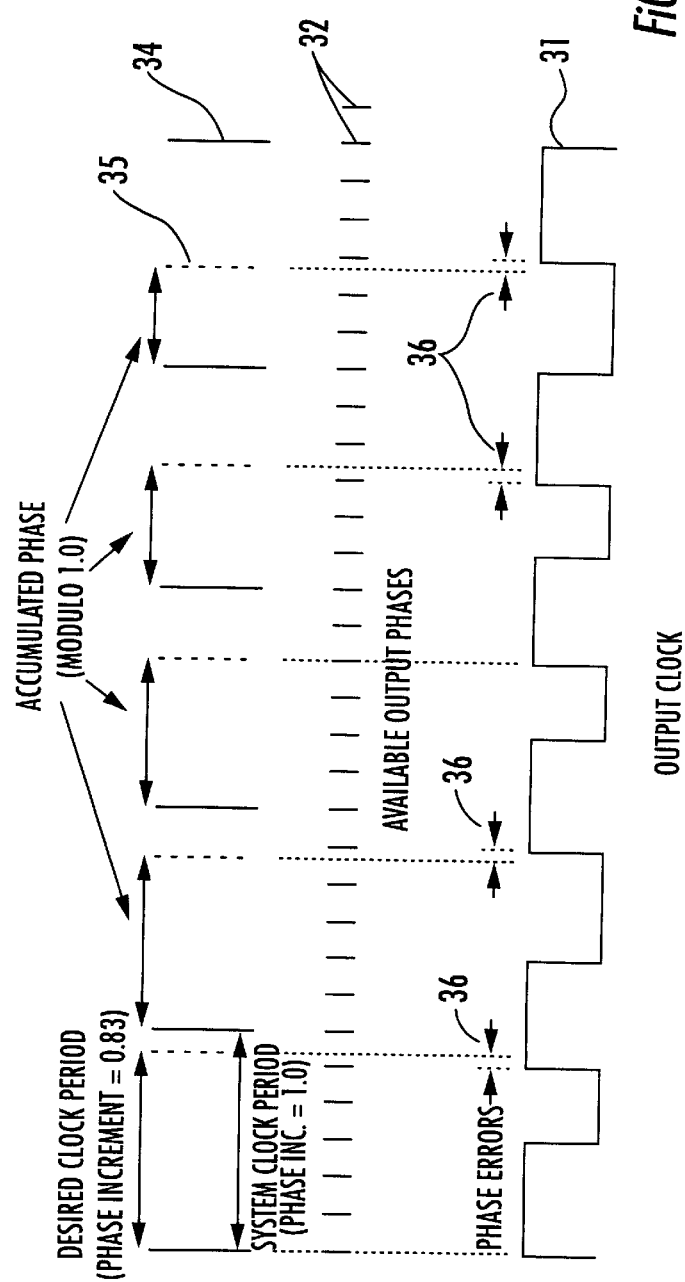

ADJUSTABLE PHASE CLOCK CIRCUIT USING THE SAME AND RELATED METHODS

FIELD OF THE INVENTION

The present invention relates to the field of electronic circuits and, more particularly, to clock circuits and related methods.

BACKGROUND OF THE INVENTION

Clock circuits are widely used in digital electronic devices and equipment for controlling logical operations and data flow. Moreover, adjustable phase clocks find wide applicability for timing adjustments and as active elements in clock recovery circuits and phase locked loops (PLLs). The PLL, in turn, is attractive for use in FM demodulators, stereo demodulators, tone detectors, frequency synthesizers, etc. Of course, a controllable phase clock can also be readily used to generate an adjustable frequency clock signal.

A conventional adjustable phase clock typically uses a voltage controlled oscillator (VCO) or a tapped delay line. Although the VCO permits a relatively large phase variability, such as desirable for a PLL, it suffers from frequency and phase instabilities inherent in an any inductor-capacitor (LC) or resistor-capacitor (RC) oscillator. A further drawback of the VCO based adjustable phase clock is that it requires a relatively large amount of analog circuitry to implement. The tapped delay line approach has a relatively high cost per delay.

Representative of a prior art clock synchronization circuit, U.S. Pat. No. 5,050,193 to Ponsard discloses a device including preprocessing circuitry for delivering to a PLL a preprocessed signal obtained from a replica of the incident digital signal staggered in time by a fraction of the cycle of the clock signal of the PLL. The device allows a fast synchronization of the clock of the PLL in relation to the incident signal, in particular at high transmission rates. The circuit includes delay means having four outputs providing, respectively four replicas of the incident digital signal, these replicas differing from each other by substantially a quarter cycle of the main clock. The delay means may be provided by an optical fiber, a conventional capacitor inductance delay circuit, or by a coaxial line.

U.S. Pat. No. 5,568,078 to Lee discloses a clock delay and compensation circuit for a PLL in a decoder of a video signal receiver. Phases of two input clocks are received by a phase comparative detector and compared to a divided reference clock from an oscillator of the phase comparative detector for obtaining a resultant phase error output. A duty ratio of the output clock is controlled in a duty controller to therefor the phase comparative detector to be used free from the duty ratio of the clock. A clock delay compensator performs correction of clock delay compensation for the system operated at high speed.

U.S. Pat. No. 5,278,457 to Fujita et al. discloses an electronic circuit including a portion for sensing temperature at a saturation state and for adjusting a clock signal phase to a fixed phase thereafter. The circuit includes two variable delay circuits controlled to have a same time delay. A phase adjustment control circuit receives a phase adjustment control signal from a service processor and has a function to switch between the phase adjusting mode and the phase fixing mode. The delays are fixed in the phase fixing mode to compensate for temperature.

Unfortunately, both conventional VCO and tapped delay line phase adjustable clocks suffer various drawbacks. The VCO phase adjustable clock suffers from frequency and phase instabilities inherent in its relatively complex analog circuitry, and the tapped delay line approach may be relatively expensive.

SUMMARY OF THE INVENTION

In view of the foregoing background, it is therefore an object of the present invention to provide an adjustable phase clock and related methods for accurately generating clock signals without the stability problems encountered in VCO circuits, and without the high costs associated with tapped delay line approaches.

This and other objects, advantages, and features in accordance with the present invention are provided by an adjustable phase clock comprising a number (n) of delay circuits having respective controllable delays and being connected in cascade for generating n respective delayed signals. A first delay circuit receives the input clock signal and an nth or last delay circuit generates a total delay signal. Locking means is preferably connected to the n delay circuits for controlling the respective delays thereof so that the total delay signal locks in relation to the input clock, such as to its period.

In addition, the adjustable phase clock preferably further includes output phase control means connected to the n delay circuits for permitting control of an adjusted phase clock output based upon selecting one of the n delayed signals having a corresponding adjusted phase delay relative to the input clock signal. Of course, multiple ones of the n delayed signals can also be selected.

The locking means may comprise means for controlling all of the n delay circuits to have a substantially equal delay. The locking means may be provided by a phase detector for receiving the input clock signal and the total delay signal and for generating a feedback control signal based upon a phase difference therebetween. A filter may be connected between the phase detector and the n delay circuits.

The output phase control means may comprise digital control input means for permitting control of the adjusted phase clock output based upon a digital control input signal. Accordingly, the adjustable phase clock may be used for locking to a synchronization signal in an incoming signal, such as a video synchronization signal. In other words, the adjustable phase clock may be used to generate a line locked clock signal. In this variation, the overall circuit includes the adjustable phase clock as described above, and phase adjust means for generating a phase adjust signal for the adjustable phase clock based upon the synchronization signal and the line locked clock signal.

The phase adjust means preferably comprises phase increment adjust means for controlling a phase increment adjustment based upon a desired frequency of the output clock signal relative to the input clock signal. The phase adjust means also preferably includes a fractional phase accumulator connected to the phase increment adjust means and the clock input signal for rounding the phase increment adjust. For example, the phase adjust means may comprise a comparator for comparing a signal related to the line locked clock signal and the synchronization signal, and generating a signal relating to a phase difference therebetween. The circuit may further comprise a modulo N counter for generating the signal related to the line locked clock signal coupled to the comparator.

In addition, to the line locking application described above, the adjustable phase clock may also be readily adapted to provide an adjustable frequency clock signal. In this embodiment, the phase adjust means may comprise a phase increment setter and a fractional phase accumulator connected to the adjustable phase clock and the clock input signal for rounding the phase adjust signal.

A method aspect of the invention is for producing a clock signal having an adjustable phase relative to an input clock signal. The method preferably comprises the steps of: connecting in cascade a number (n) of delay circuits having respective controllable delays for generating n respective delayed signals, a first delay circuit receiving the input clock signal and an nth delay circuit generating a total delay signal; controlling the respective delays of the n delay circuits so that the total delay signal locks to a period of the input clock signal; and selecting as an adjusted phase clock output at least one of the n delayed signals.

BRIEF DESCRIPTION OF THE DRAWINGS

FIG. 3 is a schematic block diagram of a clock circuit having a selectable frequency and using the adjustable phase clock in accordance with the present invention.

FIG. 4 is a timing diagram illustrating operation of the clock circuit of FIG. 3.

DETAILED DESCRIPTION OF THE PREFERRED EMBODIMENTS

Figure 1:
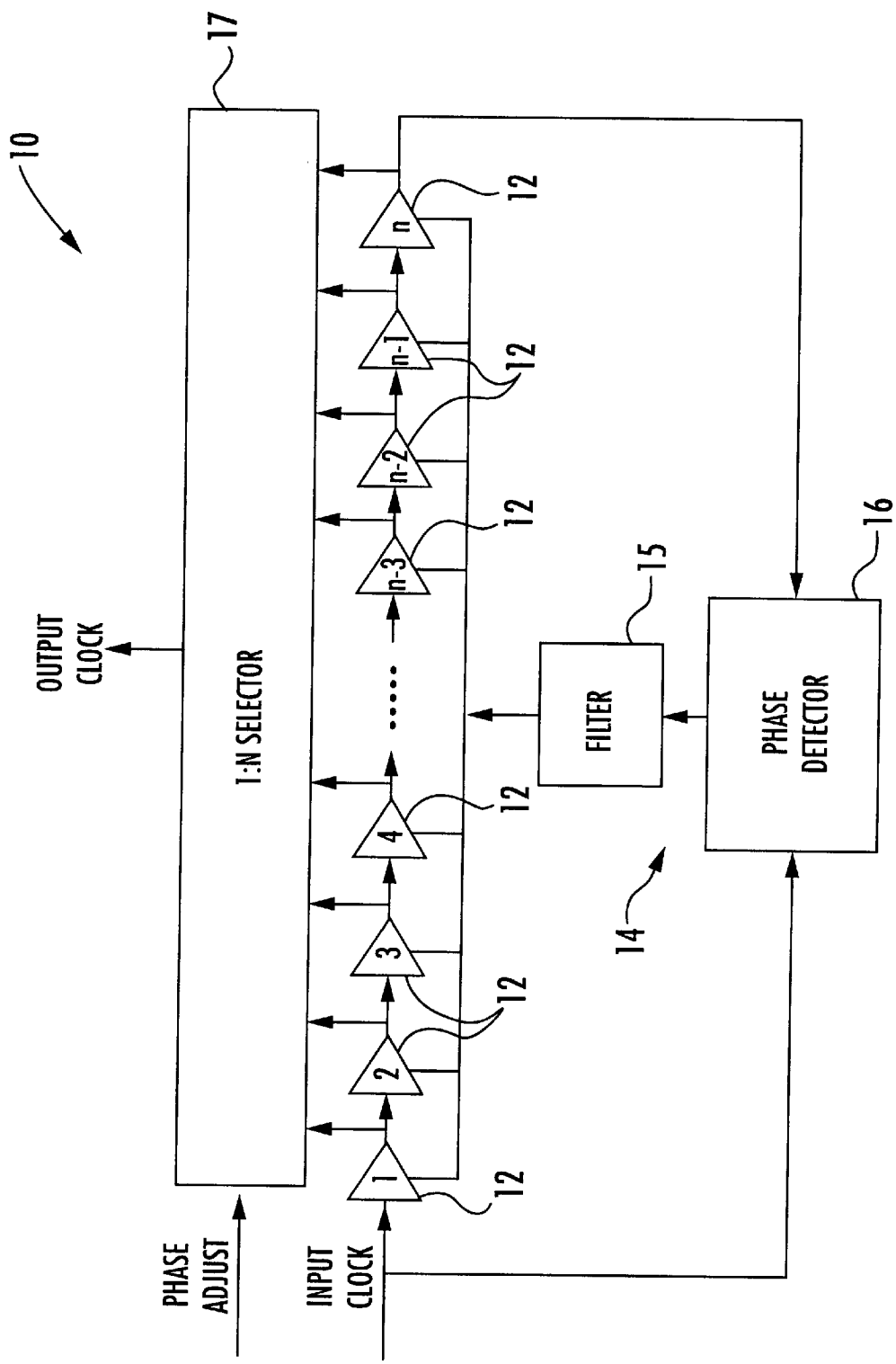
FIG. 1 is a schematic block diagram of the phase adjustable clock in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout Referring first to FIG. 1, the adjustable phase clock 10 in accordance with the present invention is described. The adjustable phase clock 10 is for producing, based upon an input phase adjust signal, an output clock signal having an adjustable phase relative to an input clock signal. The adjustable phase clock 10 illustratively includes a number (n) of delay circuits 12 having respective controllable delays and being connected in cascade for generating n respective delayed signals. A first delay circuit receives the input clock signal and an nth or last delay circuit outputs a total delay signal.

Locking means 15 is connected to n delay circuits 12 for controlling the respective delays thereof so that the total delay signal locks to a predetermined portion of the input clock signal. More particularly, the total delay signal is preferably locked to a single period of the input clock signal. In addition, the delays of the delay circuits 12 are preferably set equal to one another. As would be readily understood by those skilled in the art, the delay circuits may accept a voltage or current control input to set the delay.

In the illustrated embodiment, the locking means 14 is provided by a phase detector 16 for receiving the input clock signal and the total delay signal, and for generating a feedback control signal based upon a phase difference therebetween. The locking means 14 also includes the illustrated filter 15 connected between the phase detector 16 and the n delay circuits 12. The operation of the phase detector 16 and filter 15 will be readily appreciated by those skilled in the art without further description.

The adjustable phase clock 10 also includes output means provided by the illustrated 1:N selector 17 connected to the n delay circuits 12 and being responsive to the input phase adjust signal for selecting at least one of the n delayed signals for the output clock signal The 1:N selector preferably comprises means for permitting control of the adjusted phase clock output based upon a digital control input signal.

The adjustable phase clock 10 may find wide applicability for many timing adjustment applications, and as an active element in clock recovery circuits and phase locked loops (PLLs). The adjustable phase clock 10 according to the invention is more stable and easier to implement than conventional analog VCO approaches, and is also preferable as compared to relatively expensive tapped delay line approaches. The invention provides a substantial number of fixed phase delays which are very precise sub-multiples of the period of a fixed frequency input clock. Accordingly, selecting one of the delays as an output provides a granularity of output phase useful for many applications, such as PLLs as would be readily understood by those skilled in the art.

Figure 2:
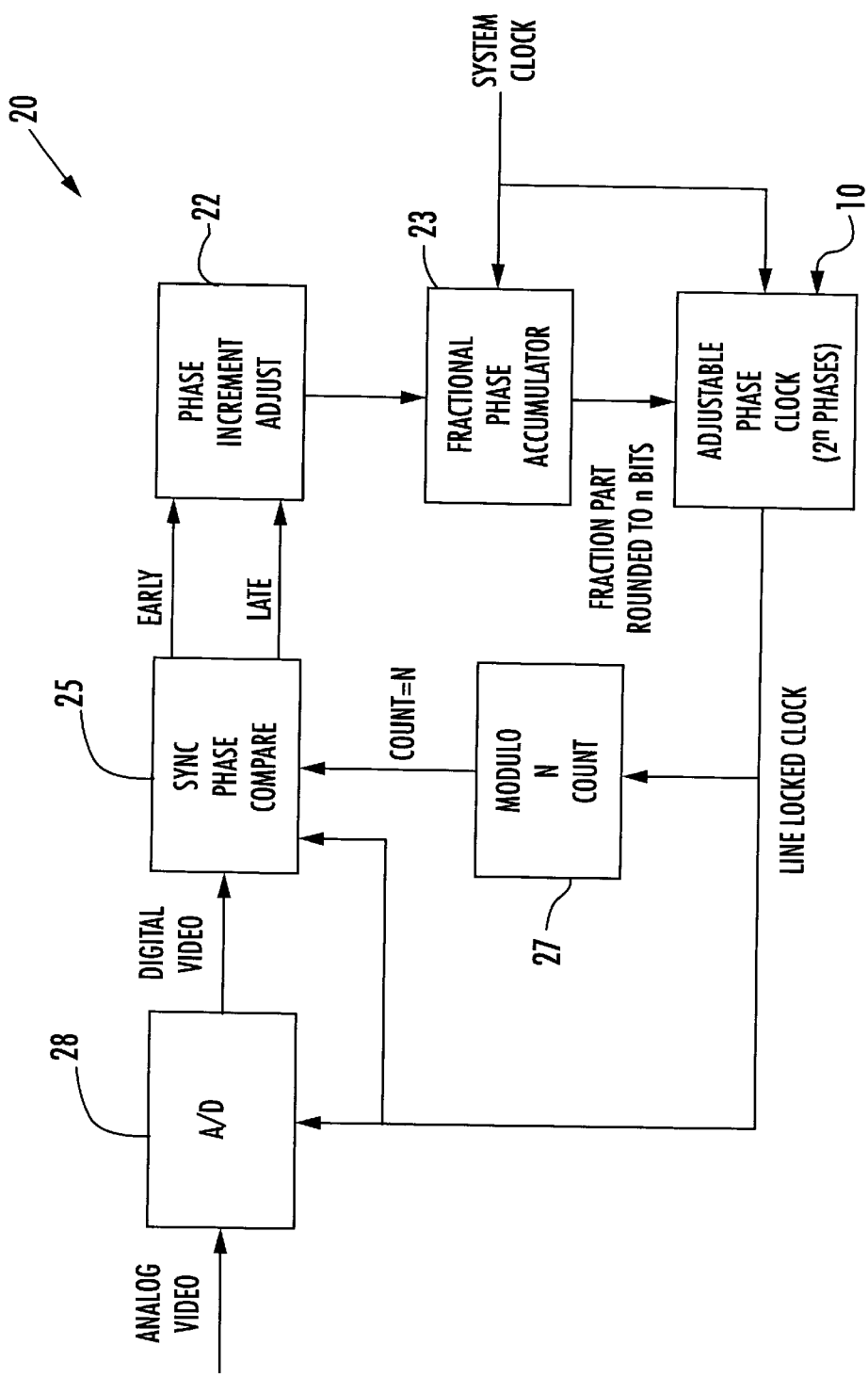
FIG. 2 is a schematic block diagram of a circuit for locking to an incoming signal and using the adjustable phase clock in accordance with the present invention.

Referring additionally to FIG. 2, an application of the phase adjustable clock 10 in a video clock circuit 20 will now be described. The video clock circuit 20 is for locking to a synchronization signal in an incoming signal, such as the illustrated analog video signal. The clock circuit includes the adjustable phase clock 10 for generating a line locked clock signal. The adjustable phase clock 10 is as described above. In this application, for example, the number n of delay circuits 12 may be greater than or equal to about thirty for the phase adjustable clock 10.

The object of the circuit 20 is to produce a line locked clock with N pixels per line with an output jitter of $\pm 1/(2^n)$ times the input clock signal period. In other words, the adjustable phase clock 10 is used as the variable phase device necessary to achieve a line locked PLL with a line locked clock output.

The circuit 20 also includes phase adjust means for generating a phase adjust signal for the adjustable phase clock 10 based upon the synchronization signal from the incoming signal and the line locked clock signal. More particularly, the phase adjust means preferably generates a digital phase adjust signal for the 1:N selector 17 of the adjustable phase clock 10. The phase adjust means is illustratively provided, in part, by the phase increment adjust circuit 22 for controlling a phase increment adjustment based upon a desired frequency of the line locked clock signal relative to the incoming signal, and a fractional phase accumulator 23 connected between the phase increment adjust circuit and the phase adjustable clock 10. The fractional phase accumulator 23 rounds the phase increment adjustment based upon the input clock signal as will be readily appreciated by those skilled in the art.

The phase adjust means may also include the illustrated sync phase comparator 25 for comparing phases of a signal related to the line locked clock signal and the synchronization signal, and generating early/late signals relating to a phase difference therebetween. The phase adjust means also illustratively includes a modulo N counter 27 for generating the signal related to the line locked clock signal coupled to the phase comparator 25 as would also be readily appreciated by those skilled in the art.

The circuit 20 accumulates a phase increment once each system clock. The accumulated phase increment determines the phase of the start of the next line locked clock output. Each time N counts of the line locked clock are accumulated, the phase of that count is compared to the phase of the horizontal sync input of the input video which is digitized at the line locked clock rate. If the N count is early relative to the horizontal sync input, the phase increment is increased. If late, the phase increment is decreased. In this way, the phase increment is precisely adjusted to yield exactly N line locked clock pulses per horizontal line interval. The line locked clock output has a jitter limited to $\pm 1/(2^n)$ of the input clock period since the adjustable phase clock 10 has $2^n$ possible phases.

The analog video input signal is processed first through the illustrate analog-to-digital converter 28 to generate the digital video signal for further processing by the clock circuit 20. The synchronization signal can be extracted from the digital video signal as will be readily understood by those skilled in the art. The adjustable phase clock 10 and associated circuitry provides line locking to the incoming synchronization signal for video receiver processing.

Turning now additionally to FIGS. 3 and 4, another application of the adjustable phase clock 10 in accordance with the invention is described. The adjustable phase clock 10 is used in combination with the illustrated phase increment setting circuit 22 and fractional phase accumulator 23 as described above to produce a frequency adjustable clock 30.

For purposes of illustration, the desired output frequency has a period of 0.83 times that of the input clock signal, corresponding to a phase increment of 0.83. By using the fractional phase accumulator 23 the total phase increment modulo 1.0 results in a calculation of the phase increment needed from the start of each system clock cycle to the start of the next output clock cycle with the proper timing to achieve the desired output frequency.

Operation of the adjustable frequency clock circuit 30 is further understood with more specific reference to the timing diagram of FIG. 4. In the diagram, the lower waveform 31 is the output of the clock circuit 30 at the approximated desired output frequency. The vertical marks 32 extending across the middle of the diagram are the available output phases from the adjustable phase clock 10. In this embodiment, only six available delays are indicated corresponding to n=6 for the number of delay circuits 12. In a practical implementation, many more delay circuits 12, such as more than thirty could be used. The solid vertical lines 34 in the upper portion of the diagram represent the system or input clock. The dashed lines 35 in the upper portion of the diagram are the ideal transition points for the clock having the adjusted frequency. The phase errors introduced by the granularity of the adjustable phase clock are shown between the pairs of arrows 36. Of course, the granularity could be reduced by increasing the number of delay circuits 12.

The adjustable phase clock 10 in accordance with the present invention may be used in many applications as will be appreciated by those skilled in the art. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A clock circuit for locking to a synchronization signal in an incoming signal, said clock circuit comprising:

an adjustable phase clock for generating a line locked clock signal; and phase adjust means for generating a phase adjust signal for said adjustable phase clock based upon the synchronization signal in the incoming signal and the line locked clock signal;

said adjustable phase clock comprising:
a number n of delay circuits having respective controllable delays and being connected in cascade for generating n respective delayed signals, a first delay circuit receiving an input clock signal and an nth delay circuit outputting a total delay signal,
locking means connected to said n delay circuits for controlling the respective delays thereof so that the total delay signal locks to a predetermined portion of the input clock signal, and
output means connected to said n delay circuits and being responsive to the phase adjust signal for selecting the n delayed signals to generate the line locked clock signal to be locked to the synchronization signal;

said phase adjust means comprising:
phase increment adjust means for controlling a phase increment adjustment based upon a desired frequency of the line locked clock signal relative to the incoming signal, and
a fractional phase accumulator connected between said phase increment adjust means and said phase adjustable clock for rounding the phase increment adjustment based upon the input clock signal.

2. A clock circuit according to claim 1 wherein said locking means comprises means for controlling all of said n delay circuits to have a substantially equal delay.

3. A clock circuit according to claim 1 wherein said locking means comprises means for controlling the respective delays of said n delay circuits so that the total delay locks to one period of the input clock signal.

4. A clock circuit according to claim 1 wherein said locking means comprises:

a phase detector for receiving the input clock signal and the total delay signal and for generating a feedback control signal based upon a phase difference therebetween; and a filter connected between said phase detector and said n delay circuits.

5. A clock circuit according to claim 1 wherein said phase adjust means comprises means for generating the phase adjust signal as a digital phase adjust signal; and wherein said output means comprises means for receiving the digital phase adjust signal.

6. A clock circuit according to claim 1 wherein each of said n delay circuits comprises a delay control input for permitting controlling the delay thereof.

7. A clock circuit according to claim 1 wherein said phase adjust means comprises a phase comparator for comparing phases of the line locked clock signal and the synchronization signal and generating a signal relating to a phase difference therebetween.

8. A clock circuit according to claim 7 wherein said phase adjust means further comprises a modulo N counter for generating the signal related to the line locked clock signal coupled to said phase comparator.

9. A clock circuit according to claim 1 wherein the incoming signal is an analog video signal; and further comprising synchronization extracting means for extracting the synchronization signal from said analog video signal.

10. A clock circuit according to claim 1 wherein n is greater than or equal to thirty.

11. A clock circuit for producing an output clock signal having a controllable frequency, said clock circuit comprising:

an adjustable phase clock for generating the output clock signal; and phase adjust means for generating a phase adjust signal for said adjustable phase clock to thereby control a frequency of the output clock signal;

said adjustable phase clock comprising:

a number n of delay circuits having respective controllable delays and being connected in cascade for generating n respective delayed signals, a first delay circuit receiving an input clock signal and an nth delay circuit outputting a total delay signal, locking means connected to said n delay circuits for controlling the respective delays thereof so that the total delay signal locks to a predetermined portion of the input clock signal, and output means connected to said n delay circuits and being responsive to the phase adjust signal for selecting the n delayed signals to generate the clock signal having a predetermined frequency relative to the input clock signal;

said phase adjust means comprising:

phase increment adjust means for controlling a phase increment adjustment based upon a desired frequency of the output clock signal relative to the input clock signal, and a fractional phase accumulator connected between said phase increment adjust means and said phase adjustable clock for rounding the phase increment adjustment based upon the input clock signal.

12. A clock circuit according to claim 11 wherein said locking means comprises means for controlling all of said n delay circuits to have a substantially equal delay.

13. A clock circuit according to claim 11 wherein said locking means comprises means for controlling the respective delays of said n delay circuits so that the total delay locks to one period of the input clock signal.

14. A clock circuit according to claim 11 wherein said locking means comprises:

a phase detector for receiving the input clock signal and the total delay signal and for generating a feedback control signal based upon a phase difference therebetween; and a filter connected between said phase detector and said n delay circuits.

15. A clock circuit according to claim 11 wherein said phase adjust means comprises means for generating the phase adjust signal as a digital phase adjust signal; and wherein said output means comprises means for receiving the digital phase adjust signal.

16. A clock circuit according to claim 11 wherein each of said n delay circuits comprises a delay control input for permitting controlling the delay thereof.

17. A clock circuit according to claim 11 wherein n is greater than or equal to thirty.

18. A method for producing a clock signal having an adjustable phase relative to an input clock signal, the method comprising the steps of:

connecting in cascade a number n of delay circuits having respective controllable delays for generating n respective delayed signals, a first delay circuit receiving the input clock signal and an nth delay circuit outputting a total delay signal;

controlling the respective delays of said n delay circuits so that the total delay signal locks to a predetermined portion of the input clock signal;

selecting, responsive to a phase adjust signal, at least one of the n delayed signals for the output clock signal so that the output clock signal has a correspondingly adjusted phase delay relative to the input clock signal; and generating the phase adjust signal to thereby control a frequency of the output clock signal by controlling a phase increment adjustment based upon a desired frequency of the output clock signal relative to the input clock signal, and rounding the phase increment adjustment based upon the input clock signal.

19. A method according to claim 18 wherein the step of controlling the respective delays comprises controlling all of the n delay circuits to have a substantially equal delay.

20. A method according to claim 18 wherein the step of controlling the respective delays comprises controlling same so that the total delay locks to one period of the input clock signal.

21. A method according to claim 18 wherein the step of controlling the respective delays comprises the steps of:

generating a feedback control signal based upon a phase difference between the input clock signal and the total delay signal; and filtering the feedback control signal for controlling the respective delays of the n delay circuits.

22. A method according to claim 18 wherein the step of selecting comprises selecting based upon the phase adjust signal as a digital control input signal.

23. A method according to claim 18 further comprising the steps of receiving an incoming signal;

extracting a synchronization signal from the incoming signal; and generating the phase adjust signal for the selecting step and based on the synchronization signal to lock the output clock signal to the synchronization signal.

24. A method according to claim 23 wherein the step of generating the phase adjust signal comprises the steps of:

controlling a phase increment adjustment based upon a desired frequency of the line locked clock signal relative to the incoming signal; and rounding the phase increment adjustment based upon the input clock signal.

25. A method according to claim 23 wherein the step of generating the phase adjust signal comprises the step of: comparing phases of the line locked clock signal and the synchronization signal and generating a signal relating to a phase difference therebetween.

26. A method according to claim 25 wherein the step of generating the phase adjust signal further comprises the step of using a modulo N counter.

27. A method according to claim 23 wherein the incoming signal is an analog video signal; and wherein the step of extracting the synchronization signal comprises extracting the synchronization signal from the incoming analog video signal.

\* \* \* \* \*